(12) United States Patent
Watanabe et al.

(10) Patent No.: US 7,985,929 B2
(45) Date of Patent: Jul. 26, 2011

(54) CIRCUIT BOARD AND METHOD OF MANUFACTURING THE SAME

(75) Inventors: Yasuto Watanabe, Wako (JP); Hiroyuki Fujita, Kawasaki (JP); Kunio Watanabe, Tokyo (JP)

(73) Assignees: Honda Motor Co., Ltd., Tokyo (JP); Shinwa Frontech Corp., Kanagawa (JP)

( * ) Notice: Subject to any disclaimer, the term of this patent is extended or adjusted under 35 U.S.C. 154(b) by 941 days.

(21) Appl. No.: 11/896,204

(22) Filed: Aug. 30, 2007

(65) Prior Publication Data
US 2008/0078572 A1    Apr. 3, 2008

(30) Foreign Application Priority Data
Aug. 31, 2006  (JP) .................... 2006-235609

(51) Int. Cl.
*H05K 1/11* (2006.01)
(52) U.S. Cl. ........................ 174/262; 174/361
(58) Field of Classification Search .............. 361/28, 361/775, 784, 807, 820, 736, 752; 174/255, 174/258, 52.1, 50.51; 257/678, 687, 690–693, 257/700–704, 723, 724
See application file for complete search history.

(56) References Cited

U.S. PATENT DOCUMENTS
5,338,208 A * 8/1994 Bross et al. ............. 439/66
5,920,459 A * 7/1999 Weber et al. ............ 361/752
6,995,322 B2 * 2/2006 Chan et al. .............. 174/262
7,122,745 B2 * 10/2006 Nakakuki ............... 174/261
2010/0117219 A1 * 5/2010 Oka et al. ............... 257/693
2010/0118505 A1 * 5/2010 Marten et al. ........... 361/803

FOREIGN PATENT DOCUMENTS
| JP | 57-103676 | 12/1980 |
| JP | 09-018136 | 1/1997 |
| JP | 10-056244 | 2/1998 |
| JP | 2000-252634 | 9/2000 |
| JP | 2005-136057 | 5/2005 |

OTHER PUBLICATIONS
Japanese Office Action dated May 31, 2011 corresponding to Japanese Patent Application No. 2006-235609.

\* cited by examiner

*Primary Examiner* — Yuriy Semenenko
(74) *Attorney, Agent, or Firm* — Squire, Sanders & Dempsey (US) LLP

(57) ABSTRACT

A circuit board and a method of manufacturing the same are provided. The circuit board includes: a multilayer board in which a plurality of conductive layers with desired patterns formed therein, and a plurality of insulating layers are stacked; a plurality of through holes penetrating the multilayer board; cylindrical recesses each formed around a through hole corresponding thereto, having a diameter larger than that of the through hole, having a depth from an outermost surface of the insulating layer to a surface of the conductive layer for electrical connection, and partially exposing the surface of the predetermined conductive layer; and a plurality of conductive terminals fitted into the through holes.

8 Claims, 9 Drawing Sheets

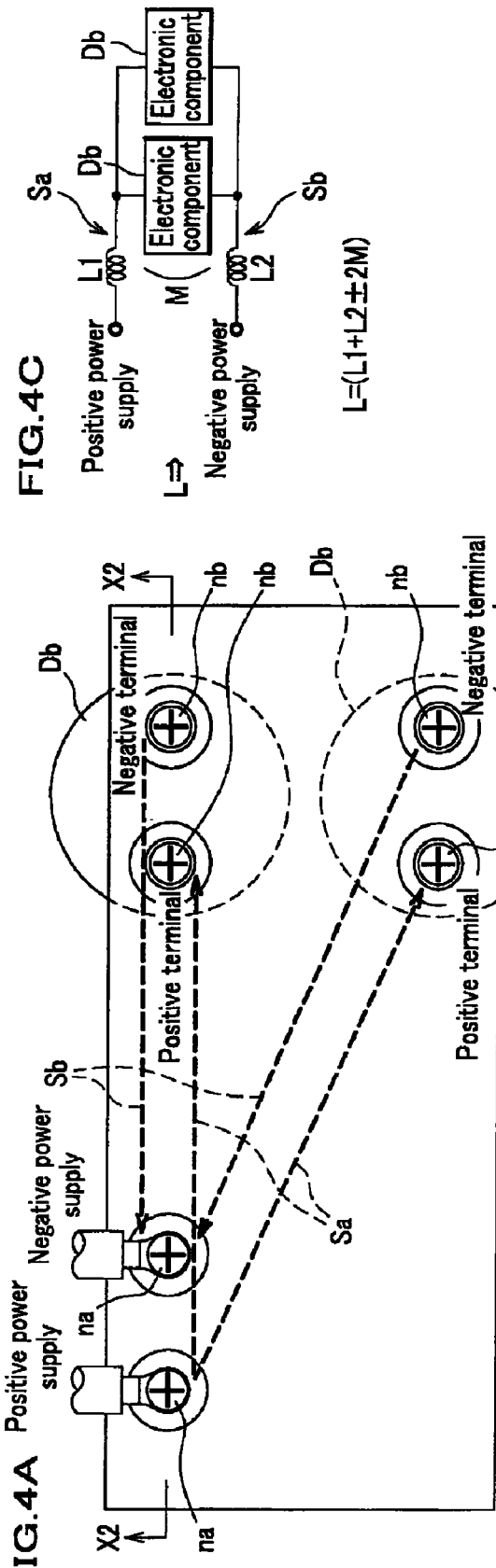
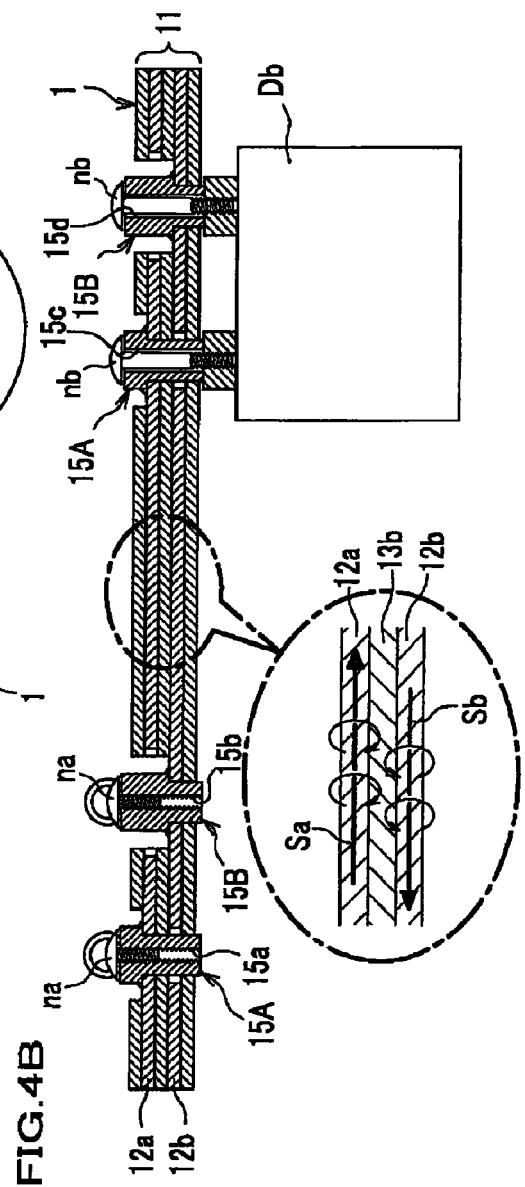
FIG.4A
FIG.4B
FIG.4C

CIRCUIT BOARD AND METHOD OF MANUFACTURING THE SAME

CROSS REFERENCE TO RELATED APPLICATIONS

This application claims the benefit of Japanese Patent Application No. 2006-235609 filed on Aug. 31,2006, the disclosure of which is incorporated herein by reference.

BACKGROUND OF THE INVENTION

1. Field of the Invention

The present invention relates to a circuit board and a method of manufacturing the same, and more specifically, to a circuit board, which allows a large electric current to flow through a circuit pattern therein, and a method of manufacturing the same.

2. Description of the Related Art

In general, use of electronic circuits has been rapidly expanded to such fields as industry machines and automobile parts. In particular, a composite circuit board has been widely used in an inverter circuit, a control circuit of a servo motor, a power supply unit, or the like. In the composite circuit board, a thin circuit pattern for a small current (for a signal) and a thick circuit pattern for a large current are formed in one insulating board. Various circuit boards having such composite circuits have been known.

FIG. 8 is a cross sectional view showing a large current circuit board according to a conventional technology. As shown in FIG. 8, a large current circuit board 60 includes an insulating board 61 made of glass epoxy material or the like; conductors 62,63 formed with copper used therein; a control circuit conductor 64 made of copper by etching both sides of the insulating board 61 or the like; and a through hole part 65 which penetrates the insulating board 61 and the conductors 62,63. Interfaces 67 between the through hole part 65 and the conductors 62,63 are copper-plated, respectively, thus forming a predetermined current conductor path through the conductors 62,63,64. Voltages having opposite polarities are applied to the conductors 62,63. In the large current circuit board 60, an ordinary conductor has a thickness of about 35 µm.

FIG. 9 and FIG. 10 are a cross sectional view and a perspective view, respectively, each showing another large current circuit board according to a conventional technology. As shown in FIG. 9 and FIG. 10, a large current circuit board 70 is formed such that different burred terminals 75 are electrically connected on an upper surface of the board 70 via a thick conductor 74 (see, for example, Japanese Laid-Open Patent Application, Publication No. H10-56244, Claim 1, FIG. 1).

Namely, the large current circuit board has a signal conductor 72 and patterned conductors 73 formed by attaching copper foil to a surface 71a of the insulating board 71 made of glass epoxy material or the like, and etching the copper foil into a predetermined pattern. The thick conductor 74 is formed by cutting a copper sheet into a predetermined pattern, and is soldered to the pattered conductor 73, which is etched in a shape corresponding to the large current thick conductor 74.

In the large current circuit board 70, the burred terminal 75 burred in a cylindrical shape is inserted into the through hole part 76, which penetrates the insulating board 71. Then an end 75a of the burred terminal 75 is soldered to a patterned conductor 77, which is formed on an underside 71b of the insulating board 71. As shown in FIG. 10, when a plurality of different burred terminals 75 are electrically connected, a plurality of thick conductors 74 each in a rod shape with an insulated surface thereof are disposed one above another. This means that the large current circuit board 70 has a larger volume in a height direction thereof, as a circuit thereof becomes more complicated. In the large current circuit board 70, an ordinary conductor has a thickness of about 210 to 500 µm.

The large current circuit board 60 shown in FIG. 8 is not suitable, however, for flowing a large current therethrough, because an area of the interfaces 67 between the through hole part 65 and the conductors 62,63 are substantially small. Nonetheless, reduction of a combined inductance (a surge reduction) can be expected, since the conductors 62,63 in the insulating board 61 are provided close to each other. To flow a large current through the large current circuit board 60 shown in FIG. 8, it is necessary to provide a large number of the through hole parts 65, to thereby increase a total electrical contact area of the interfaces 67. However, a more complicated manufacturing process is required to provide the large number of the through hole parts 65.

As compared to the large current circuit board 60, the large current circuit board 70 shown in FIG. 9 and FIG. 10 is suitable for flowing a large current therethrough. However, the large current circuit board 70 requires a longer time in forming and placing the thick conductors 74 therein, because the thick conductors 74 have to be placed between a plurality of the through hole parts 76 for each current path. Further, there may be a region in the large current circuit board 70, in which a plurality of the thick conductors 74 are multilayered in the height direction. As a result, an area for placing other components inevitably becomes smaller, and a thickness of the board becomes larger. Moreover, reduction of a combined inductance (a surge reduction) cannot be so much expected in the large current circuit board 70 as in the large current circuit board 60 shown in FIG. 8, because a distance between the opposing patterned conductors 73,77 is larger in the large current circuit board 70.

The present invention has been made in light of the above-mentioned problems. The present invention provides a circuit board capable of flowing a large current therethrough with a relatively simple configuration and without increasing a size thereof in the thickness direction. The present invention also provides a method of manufacturing the circuit board.

SUMMARY OF THE INVENTION

According to an aspect of the present invention, a circuit board includes: a multilayer board, in which a plurality of insulating layers and a plurality of conductive layers are alternately stacked; and a plurality of conductive terminals, which are fitted into a plurality of through holes extending in a thickness direction of the multilayer board at predetermined positions thereof. The multilayer board includes cylindrical recesses each having a diameter larger than that of the through hole, having a depth from an outermost insulating layer in the multilayer board to a surface of a predetermined conductive layer in the multilayer board, and partially exposing the surface of the predetermined conductive layer. The conductive layer and the conductive terminal are electrically connected at an interface between the conductive layer and the conductive terminal in the through hole, and at an electrical interface between the conductive terminal and the partially exposed surface of the conductive layer in the predetermined conductive terminal.

In the aspect of the present invention, in the circuit board having the above-mentioned configuration, the conductive layer and the conductive terminal are electrically connected at the interface in the through hole and at the electrical interface on the partially exposed surface of the conductive layer, which is exposed by forming the cylindrical recess. In this way, the circuit board can secure a current path having a large electrical contact area between the conductive layer and the conductive terminal, thus enabling the circuit board to flow a large current therethrough. Further, because the circuit board has the large electrical contact area, when the circuit board flows a large current therethrough, it is possible to prevent that the current is concentrated on the through hole, and a temperature at the through hole goes up.

It is to be noted that the cylindrical recess may be formed concentric with the through hole, or may have a center thereof offset from that of the through hole.

According to another aspect of the present invention, in a method of manufacturing a circuit board, the circuit board includes: a multilayer board, in which a plurality of insulating layers and a plurality of conductive layers are alternately stacked; and a plurality of conductive terminals, which are fitted into a plurality of through holes extending in a thickness direction of the multilayer board at predetermined positions thereof. The method of manufacturing the circuit board includes: a first step of forming the through holes each penetrating the multilayer board in a thickness direction thereof; a second step of forming cylindrical recesses each having a diameter larger than that of the through hole, provided by drilling from an outermost insulating layer in the multilayer board to a surface of a predetermined conductive layer in the multilayer board, and partially exposing the surface of the predetermined conductive layer; a third step of fitting the conductive terminal into the through hole corresponding thereto; and a fourth step of connecting via conductive connecting material at least either at an interface between the conductive layer and the conductive terminal in the through hole, or at an electrical interface between the conductive terminal and the partially exposed surface of the conductive layer in the cylindrical recess.

In another aspect of the present invention, in the method of manufacturing the circuit board including the above-mentioned steps, the cylindrical recess is formed before the conductive terminal is fitted into the through hole, and the conductive terminal is electrically connected to the partially exposed surface of the conductive layer, which is exposed by forming the cylindrical recess. The circuit board is heated to a predetermined temperature with the conductive connecting material applied therein, such as cream solder. Then the conductive terminal fitted into the through hole is electrically connected to the conductive layer at the interface in the through hole and at the electrically interface in the cylindrical recess. As a result, the circuit board can secure a current path having a large electrical contact area between the conductive layer and the conductive terminal.

Other features and advantages of the present invention will become more apparent from the following detailed description of the invention, when taken in conjunction with the accompanying exemplary drawings.

BRIEF DESCRIPTION OF THE DRAWINGS

FIG. 4A is a plan view showing the circuit board of the present invention, to which electronic components are connected. FIG. 4B is a cross sectional view of FIG. 4A. FIG. 4C is a schematic view for explaining inductance in the circuit board of FIG. 4A.

DETAILED DESCRIPTION OF EXEMPLARY EMBODIMENTS

With reference to attached drawings, exemplary embodiments of the present invention are described next in detail.

First Embodiment

<General Configuration of Circuit Board>

Figure 1:
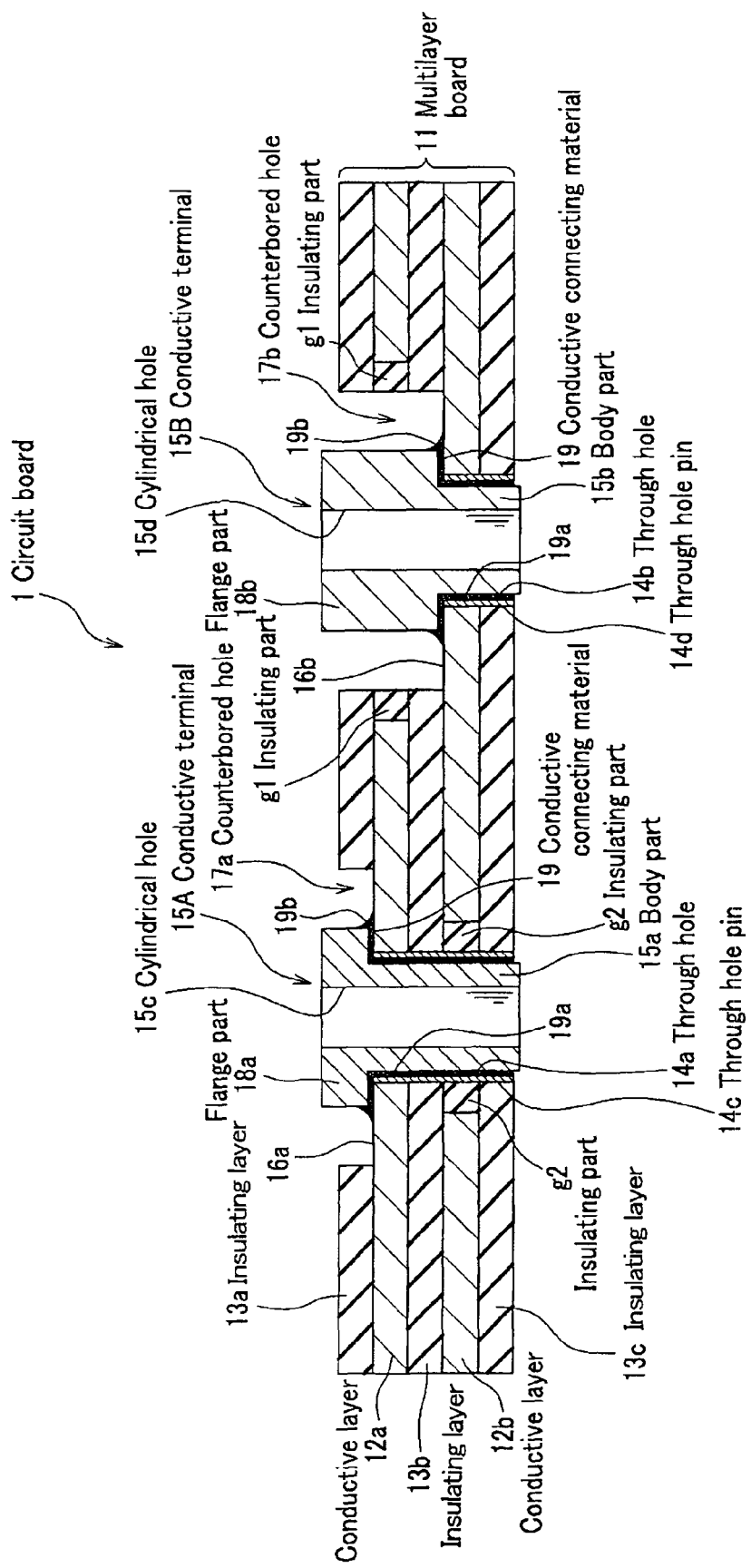
FIG. 1 is a cross sectional view schematically showing a configuration of a circuit board according to a first embodiment of the present invention.

As shown in FIG. 1, the circuit board 1 includes a multilayer board 11, conductive terminals 15A,15B, and through hole pins 14c,14d.

The multilayer board 11 is formed by alternately stacking insulating layers 13a,13b,13c and conductive layers 12a,12b. The insulating layers 13a,13b,13c are thin layers made of insulating material such as glass epoxy resin. The conductive layers 12a,12b are thin layers made of copper, for example, and have predetermined circuit patterns therein.

The insulating layers 13a,13b,13c and the conductive layers 12a,12b have each suitable thickness according to material thereof, a magnitude of a current which is to flow through the conductive layers 12a,12b, and a size of the circuit board 1.

The multilayer board 11 has cylindrical through holes 14a, 14b, which penetrate the multilayer board 11 at predetermined positions thereof; and counterbored holes (cylindrical recesses) 17a,17b to be described later, which penetrate the insulating layer 13a or the insulating layers 13a,13b so as to reach the conductive layers 12a,12b. Cylindrical through hole pins 14c,14d made of copper are fitted into the through holes 14a,14b, respectively. Conductive terminals 15A,15B made of copper are provided on respective inner circumferences of the through hole pins 14c,14d.

An insulating part g1 is provided around a portion of the counterbored hole 17b, which is in contact with the conductive layer 12b, so as to ensure insulation between the conductive terminal 15B and the conductive layer 12a. An insulating part g2 is provided around a portion of the through hole 14a, which is in contact with the conductive layer 12a, so as to ensure insulation between the conductive terminal 15A and the conductive layer 12b. The insulating part g1 has a larger cross section than the counterbored hole 17b (see FIG. 3B). The insulating part g2 has a larger cross section than the counterbored hole 14a (see FIG. 3B). It is to be noted that, in FIG. 3A to FIG. 3C, markings M1 indicate outer circumferences of the through holes 14a,14b, and markings M2 indicate outer circumferences of the counterbored holes 17a,17b.

<Through Hole>

As shown in FIG. 1, the through holes 14a,14b are cylindrical holes penetrating the multilayer board 11 in a thickness direction thereof. When the counterbored hole 17a,17b to be described later are formed, the through hole 14a penetrates the conductive layers 12a,12b and the insulating layers 13b, 13c, and the through hole 14b penetrates the conductive layer 12b and the insulating layer 13c.

<Counterbored Hole>

As shown in FIG. 1, the counterbored holes 17a,17b are cylindrical holes, are concentric with the through holes 14a, 14b, and are larger than those in diameter, respectively. The counterbored hole 17a is formed to penetrate the insulating layer 13a, to thereby expose a partial upper surface (a partially exposed surface) 16a of the conductive layer 12a. The counterbored hole 17b is formed to penetrate the insulating layer 13a, conductive layer 12a, and insulating layer 13b, to thereby expose a partial upper surface (a partially exposed surface) 16b of the conductive layer 12b.

<Through Hole Pin>

The through hole pins 14c,14d are cylindrical members and are made of conductive material such as copper. The through hole pins 14c,14d have diameters to come in contact with the conductive layers 12a,12b in the through holes 14a, 14b, respectively. The through hole pins 14c,14d have lengths corresponding to depths of the through holes 14a,14b, respectively.

<Conductive Terminal>

The conductive terminals 15A,15B are made of conductive material such as copper. The conductive terminals 15A,15B include flange parts 18a,18b, which are larger than the through holes 14a,14b in diameter; and body parts 15a,15b, which are smaller than the flange parts 18a,18b in diameter, respectively. The conductive terminals 15A,15B have therein cylindrical holes (communication holes) 15c,15d penetrating upper ends through lower ends of the conductive terminals 15A,1513, respectively. The body parts 15a,15b have diameters to fit into the through hole pins 14c,14d, respectively. The flange part 18a has a diameter smaller than that of the counterbored hole 17a, and is electrically connected to the partial upper surface 16a of the conductive layer 12a at an electrical interface 19b. The flange part 18b has a diameter smaller than that of the counterbored hole 17b, and is electrically connected to the partial upper surface 16b of the conductive layer 12b at another electrical interface 19b. The flange parts 18a,18b and the body parts 15a,15b have lengths corresponding to depths of the counterbored holes 17a,18b and the through holes 14a,14b, respectively.

<Conductive Connecting Material>

Conductive connecting material 19 is provided between the body part 15a and the through hole pin 14c, between the body part 15b and the through hole pin 14d, and at the electrical interfaces 19b. The conductive connecting material 19 in the present embodiment is solder, which may be provided by known methods such as dip soldering and cream soldering. The conductive connecting material 19 fills gaps between the conductive terminals 15A,15B, through hole pins 14c,14d, and conductive layers 12a,12b, while keeping conductivity therebetween. The conductive connecting material 19 also fixes the conductive terminals 15A,15B into the multilayer board 11.

<Electrical Connection>

In the circuit board 1 having a configuration as described above, the conductive terminal 15A and the conductive layer 12a are electrically connected, and the conductive terminal 15B and the conductive layer 12b are electrically connected. More specifically, the conductive layer 12a is electrically connected not only to the through hole pin 14c at an interface 19a, but also to the conductive terminal 15A at the electrical interface 19b. This makes a surface area of a current path larger, because the flange part 18a of the conductive terminal 15A contacts the partial upper surface 16a of the conductive layer 12a via the conductive connecting material 19. Further, the conductive layer 12b is electrically connected not only to the through hole pin 14d at another interface 19a, but also to the conductive terminal 15B at another electrical interface 19b. This makes the surface area of the current path larger, because the flange part 18b of the conductive terminal 15B contacts the partial upper surface 16b of the conductive layer 12b via the conductive connecting material 19.

Herein, in the circuit board 1, voltages having opposite polarities are applied to the conductive layers 12a,12b. In a predetermined region in the circuit board 1, currents in opposite directions flow through the conductive layers 12a,12b, which are provided close to each other. Hence, magnetic fluxes generated by the currents flowing through the conductive layers 12a,12b are cancelled from each other, thus reducing a combined inductance (or a surge) (see FIG. 4).

<Variations of Configuration>

In the circuit board 1, materials and shapes of the insulating layers 13a,13b,13c, conductive layers 12a,12b, conductive terminals 15A,15B, through hole pins 14c,14d are not limited to those shown in FIG. 1. However, any other materials and shapes may be used. In FIG. 1, the two conductive layers 12a,12b are provided. However, three or more conductive layers may be provided. In FIG. 1, the two conductive terminals 15A,15B are provided. However, three or more conductive terminals may be provided according to the number of the conductive layers, or of electronic components (see FIG. 4) to be mounted afterwards for making the circuit board 1 a finished product.

In the circuit board 1, gaps are created around outer circumferences of the flange parts 18a,18b, because the counterbored holes 17a,17b have larger diameters than those of the flange parts 18a,18b of the conductive terminals 15A,15B, respectively. The gaps facilitate soldering (insertion of a soldering iron into the counterbored holes 17a,17b). However, another configuration is possible, in which the counterbored holes 17a,17b have substantially same diameters as those of the conductive terminals 15A,15B, respectively, and the insulating layer 13a or the like comes in contact with the outer circumferences of the flange parts 18a,18b without gaps.

In the circuit board 1, the upper ends of the conductive terminals 15A,15B are positioned higher than an upper surface of the insulating layer 13a. Since the conductive terminals 15A,15B stand higher and the gaps are created around the inner circumferences of the counterbored holes 17a,17b, electronic components to be described later (see FIG. 4) can be connected onto the conductive terminals 15A,15B more easily. However, the upper ends of the conductive terminals 15A,15B may be positioned equal to or lower than the upper surface of the insulating layer 13a, according to a size of an electronic component to be mounted or a height limit of a space in which the circuit board 1 is used.

Instead of the cylindrical holes 15c,15d, the conductive terminals 15A,15B may have grooves for screwing up the electronic components to be described later.

It is to be noted that, in the circuit board 1, a single conductive layer has a thickness of about 400 µm, for example, and a single insulating layer has a thickness of about 500 µm, for example.

<Steps in Method of Manufacturing Circuit Board>

Figure 2A:
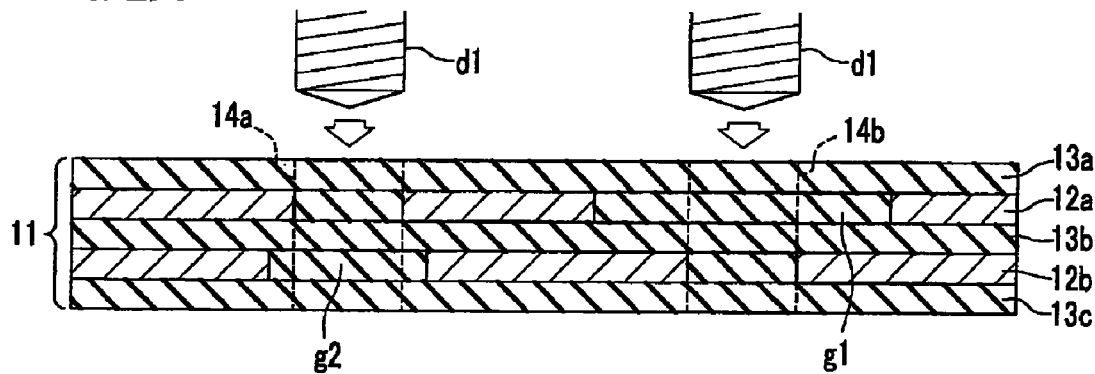
FIG. 2A to FIG. 2D are sequential cross sectional views each schematically showing a key step in a method of manufacturing the circuit board according to the first embodiment.

Next is described a method of manufacturing the circuit board 1 mainly with reference to FIG. 2A to FIG. 2D. FIG. 2A to FIG. 2D are sequential cross sectional views each schematically showing a key step in the method of manufacturing the circuit board 1 of FIG. 1. FIG. 3A to FIG. 3C are plan views showing each layer of the circuit board 1. FIG. 4A is a plan view showing the circuit board 1, to which the electronic components are connected. FIG. 4B is a cross sectional view of FIG. 4A. FIG. 4C is a schematic view for explaining inductance in the circuit board 1 of FIG. 4A. It is to be noted that FIG. 1 is a cross sectional view when cut along the line X1-X1 of, for example, FIG. 3A, FIG. 3B or FIG. 3C.

First, the multilayer board 11 is manufactured. The insulating layers 13a,13b,13c are prepared separately, as shown in FIG. 3A, FIG. 3B and FIG. 3C, respectively. The prepared insulating layers 13a to 13c are integrally stacked such that the insulating layer 13a is in an uppermost position; the insulating layer 13b is in an intermediate position with the conductive layer 12a provided thereon; and the insulating layer 13c is in a lowermost position with the conductive layer 12b provided thereon. Thus the multilayer board 11 is manufactured as shown in FIG. 2A. The multilayer board 11 is pressed to have a multilayered structure, in which the layers 13a,13b,13c and 12a,12b are closely stuck to each other. Round holes 82 formed at respective four corners of the insulating layers 13a,13b,13c are screw holes used for screwing up the entire circuit board 1. Small holes 84 penetrating the respective layers at predetermined positions are terminal holes for soldering connectors and electrical wires.

In the multilayer board 11, the markings M1 for indicating outer circumferences of through holes and the markings M2 for indicating those of counterbored holes are provided on the uppermost insulating layer 13a, as shown in FIG. 3A. This makes it possible for an operator to visually check where to drill the holes. Either or both of the markings M1,M2 are also provided on the conductive layer 12a and insulating layer 13b, as shown in FIG. 3B and FIG. 3C. It is assumed that a position, a depth, and the like to be drilled by drills d1,d2 (not shown) used herein are numerically controlled.

As shown in FIG. 2A, a first step of manufacturing the circuit board 1 is a step of forming the through holes 14a,14b. The through holes 14a,14b are formed to mechanically penetrate the multilayer board 11 in a thickness direction thereof at respective predetermined positions. Herein, numerically-controlled small-diametered drills d1,d1 create the through holes 14a,14b simultaneously or separately.

Figure 2B:
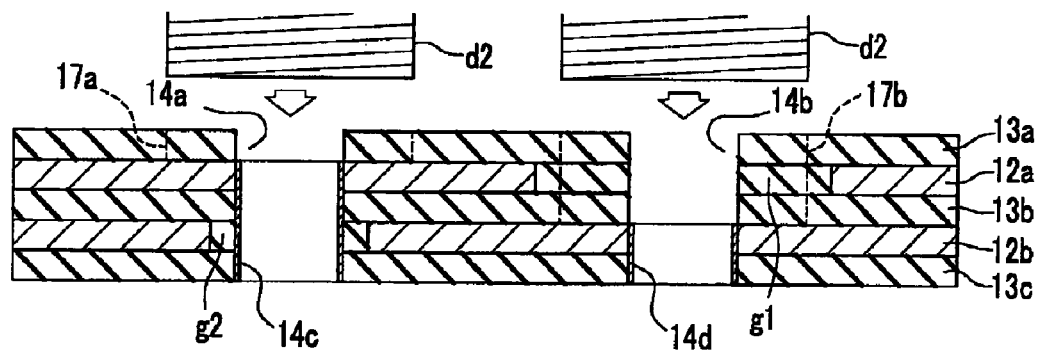
Figure 3A:
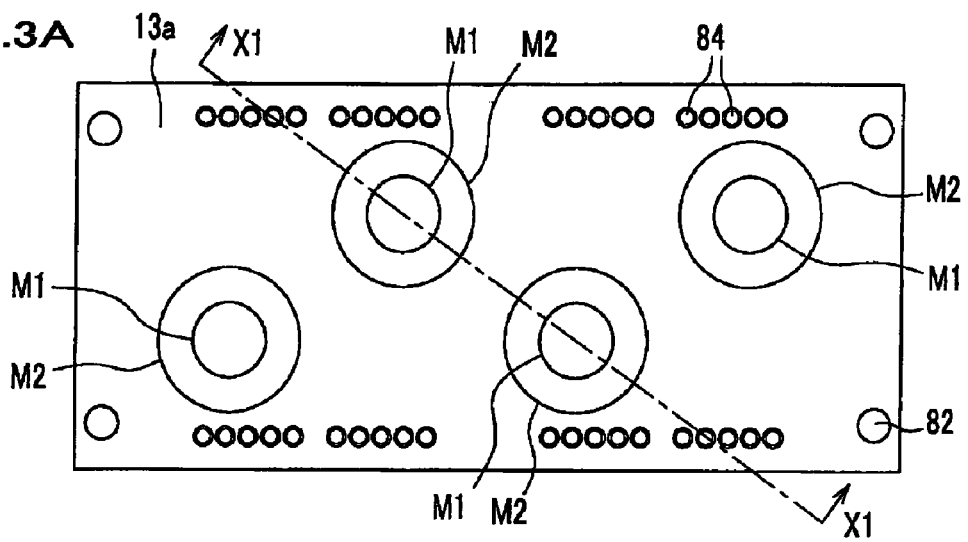
FIG. 3A to FIG. 3C are plan views each showing the circuit board of the present invention, before a multilayer board is stacked.
Figure 3B:
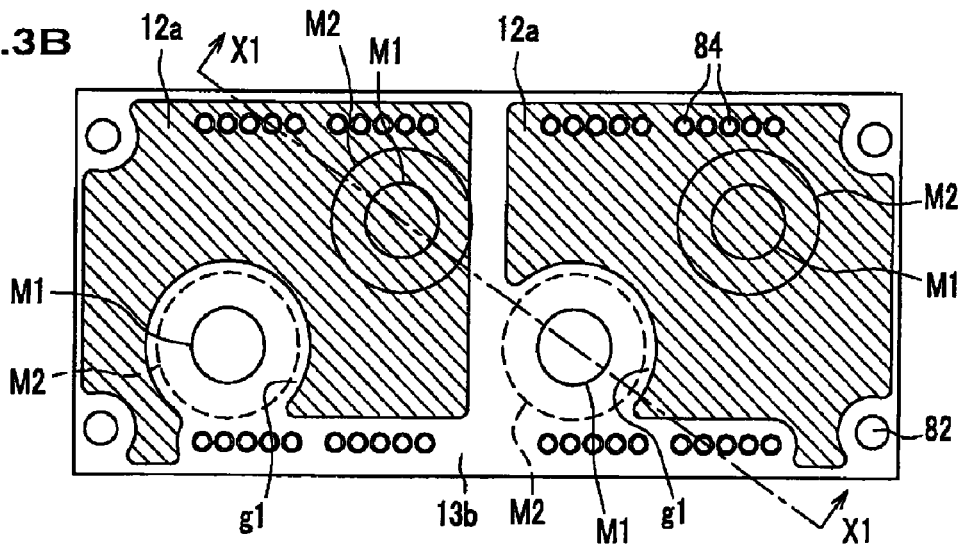
Figure 3C:
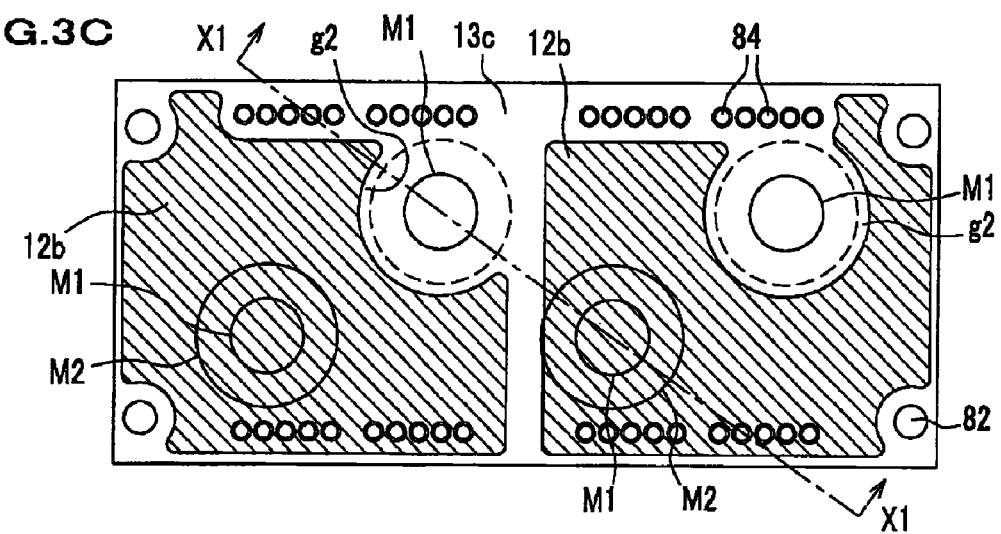

As shown in FIG. 2B, a second step is a step of forming the counterbored holes 17a,17b. In forming the counterbored hole 17a, a numerically-controlled large-diametered drill d2 is used to drill a hole, such that the hole reaches the partial upper surface 16a of the conductive layer 12a and is concentric with the through hole 14a. In forming the counterbored hole 17b, a numerically-controlled large-diametered drill d2 is also used to drill a hole, such that the hole reaches the partial upper surface 16b of the conductive layer 12b and is concentric with the through hole 14b. The drill d2 used herein has a flat tip thereof. It is to be noted that, in the present art, a diameter of 0.5 mm or less may be regarded as a "small diameter", and a diameter of more than 0.5 mm may be regarded as a "large diameter". However, the "small diameter" and the "large diameter" are herein referred to just for relatively indicating the diameter of the drill d1 (for example, about 6.0 mm) and that of the drill d2 (for example, about 12.0 mm), respectively.

As shown also in FIG. 2B, an insertion step is performed between the second and third steps. In the insertion step, the through hole pins 14c,14d are inserted into the through holes 14a,14b, respectively. The insertion is carried out automatically by an automated operating machine or manually by an operator, both not shown. The through hole pins 14c,14d are provided to facilitate and ensure insertion of the conductive terminals 15A,15B, respectively. However, the through hole pins 14c,14d are not indispensably required and may be omitted. Namely, the conductive terminals 15A,15B may be inserted directly into the through holes 14a,14b, respectively. Instead of using the through hole pins 14c,14d, inner surfaces of the through holes 14a,14b may be metal plated. In this case, for example, the through holes 14a,14b may be first created in the multilayer board 11 using the drill d1. Entire surfaces of the through holes 14a,14b are then subjected to nonelectrolytic copper plating. After that, the counterbored holes 17a,17b are created using the drill d2.

Figure 2C:
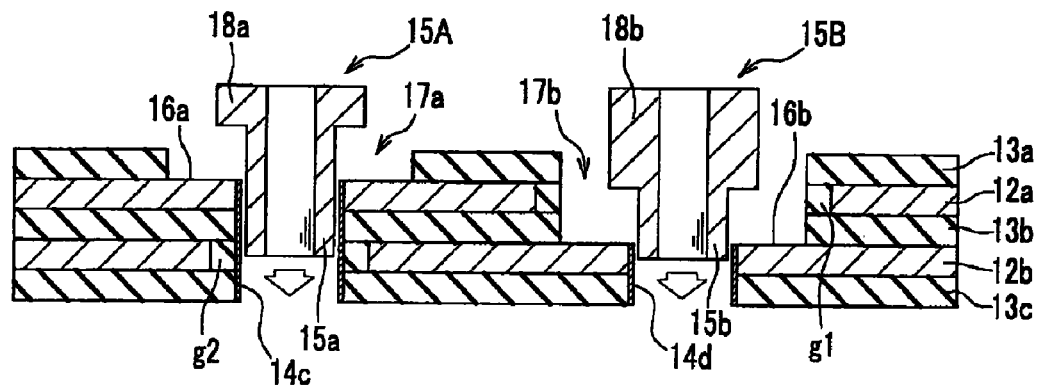

As shown in FIG. 2C, a third step is a step of fitting the conductive terminals 15A,15B into the multilayer board 11. More specifically, the conductive terminals 15A,15B are set such that the body parts 15a,15b thereof are fitted into the through hole pins 14c,14d, respectively, and the flange parts 18a,18b thereof come in contact with the partial upper surfaces 16a,16b, respectively. Herein, the partial upper surfaces 16a,16b are in exposed states by the counterbored holes 17a, 17b, respectively. The conductive terminals 15A,15B are set automatically by an automated operating machine or manually by an operator, both not shown. Alignment of the conductive terminals 15A,15B is easily performed by inserting the conductive terminals 15A,15B all the way into the through hole pins 14c,14d, because the conductive terminals 15A,15B have the flange parts 18a,18b, and the body parts 15a,15b have lengths corresponding to depths of the through hole pins 14c,14d, respectively.

Figure 2D:
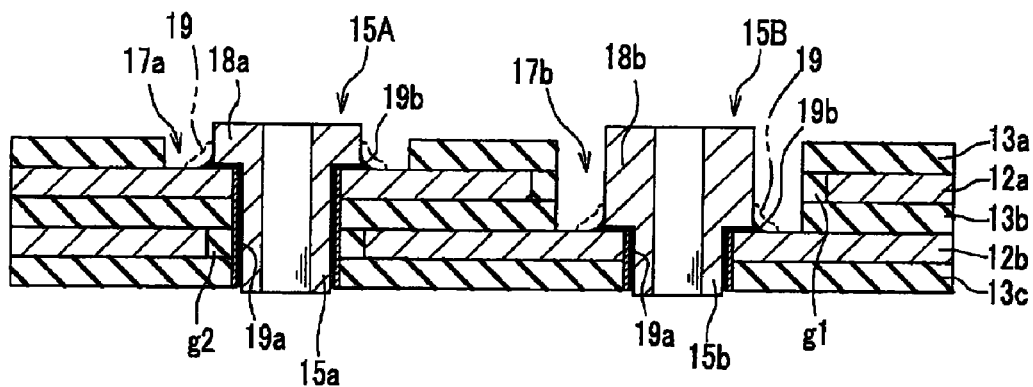

As shown in FIG. 2D, a fourth step is a step of applying the conductive connecting material 19. Herein, cream solder is used as the conductive connecting material 19, and reflow soldering with cream solder is used as a soldering method. The conductive connecting material 19 is applied to circumferential edges of the flange parts 18a,18b, which are shown in dotted lines in FIG. 2D. The conductive connecting material 19 flows into respective gaps between the conductive terminals 15A,15B, counterbored holes 17a,17b, through holes 14a,14b, and through hole pins 14c,14d. It would be preferable that an amount of the conductive connecting material 19 to be applied is sufficient to ensure large electrical contact areas between side surfaces of the flange parts 18a, 18b and the partial upper surfaces 16a,16b, respectively, even after the conductive connecting material 19 is heated and melted to flow into the gaps. Heating and melting the conductive connecting material 19 is to be described later.

As shown in FIG. 2D, a fifth step is a step of heating the circuit board 1 with the conductive connecting material 19 applied thereon, to a predetermined temperature using a heating furnace not shown. The conductive connecting material 19 is heated and melted to flow into gaps created between the flange parts 18a,18b and counterbored holes 17a,17b, between the body parts 15a,15b and through hole pins 14c, 14d, or the like. The conductive connecting material 19 in the gaps forms the interfaces 19a and the electrical interfaces 19b, thus ensuring electrical connections between the conductive terminals 15A,15B and conductive layers 12a,12b, respectively. The conductive connecting material 19 also resultantly fixes the above-mentioned members.

The soldering used herein is not limited to the reflow soldering as described above, and may be any known flow soldering. If the flow soldering is used, the cylindrical holes 15c,15d are preferably covered with a polyimide film-based heat-resistant masking tape or the like, before the soldering. This ensures protection of insides of the cylindrical holes 15c,15d shown in FIG. 1.

When the conductive terminals 15A,15B are set, the flange parts 18a,18b thereof come in contact with the partial upper surfaces 16a,16b (see FIG. 2C), which are exposed by the counterbored hole 17a,17b, respectively. This results in large electrical contact areas between the conductive terminals 15A,15B and the conductive layers 12a,12b, respectively, thus increasing a surface area of a current path.

Next are described electronic components Db mounted in the circuit board 1 with reference to FIG. 4A and FIG. 4B. It is assumed herein that a power supply circuit (not shown) is connected to the conductive terminals 15A,15B via screws na,na, respectively, and electronic components Db are connected to another conductive terminals 15A,15B via screws nb,nb, respectively. The electronic components Db may be a switching element (for example, IGBT, MOSFET, or the like), a capacitor, a snubber circuit, or the like.

FIG. 4B is a cross sectional view showing the circuit board 1, when FIG. 4A is cut along the line X2-X2. FIG. 4C is a schematic view showing an electrical circuit when an electric current flows through the circuit board 1 of FIG. 4. In FIG. 4B, the conductive terminals 15A,15B on a left side of the figure have taps (internal screws) on upper portions of the cylindrical holes 15a,15b thereof, respectively, and are directly screwed with the screws na,na, which are connected to the power supply circuit. The conductive terminals 15A,15B on a right side of the figure does not have taps on upper portions of the cylindrical holes 15c,15d, but have taps inside screws nb,nb, and are connected to the electronic components Db.

Figure 8:
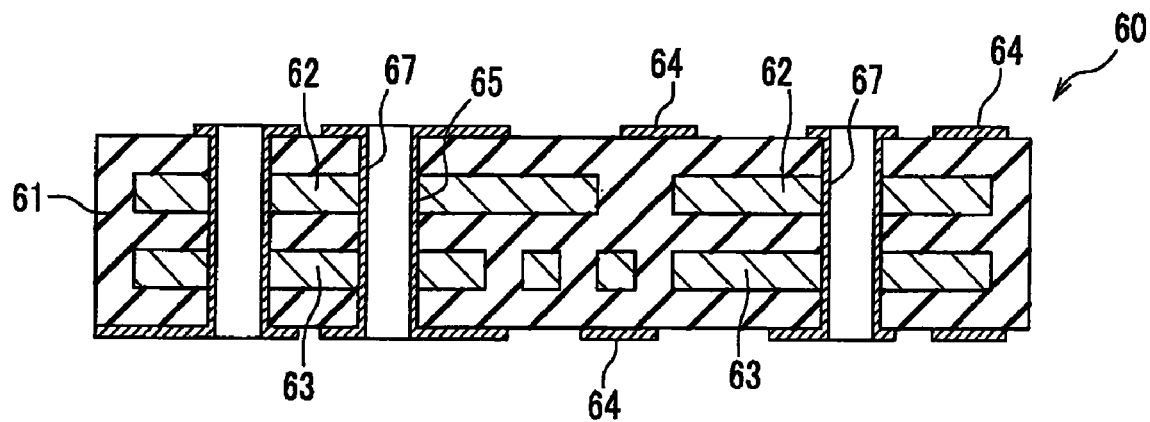
FIG. 8 is a cross sectional view showing a large current circuit board according to related art.
Figure 9:
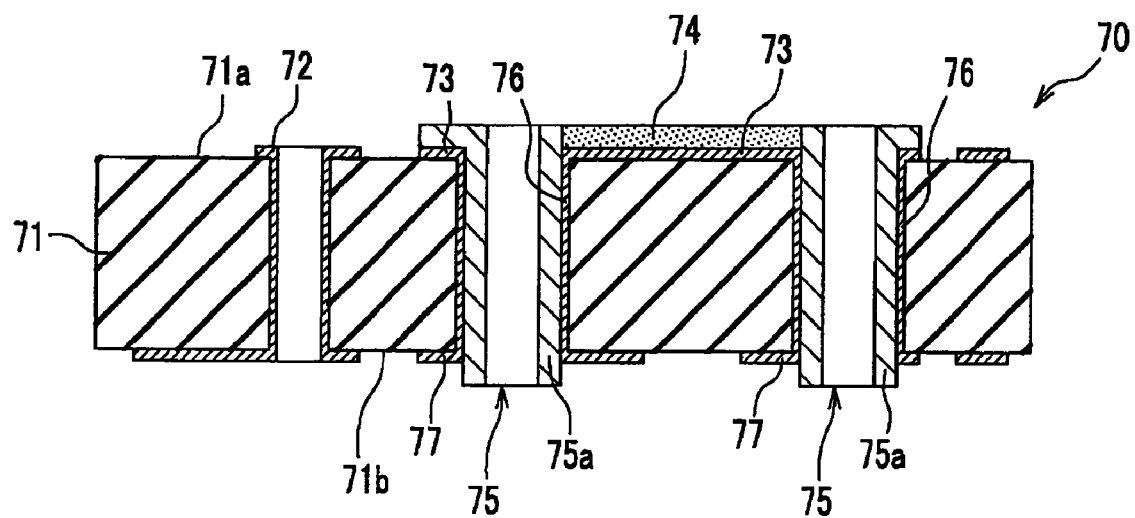
FIG. 9 is a cross sectional view showing another circuit board according to related art.
Figure 10:
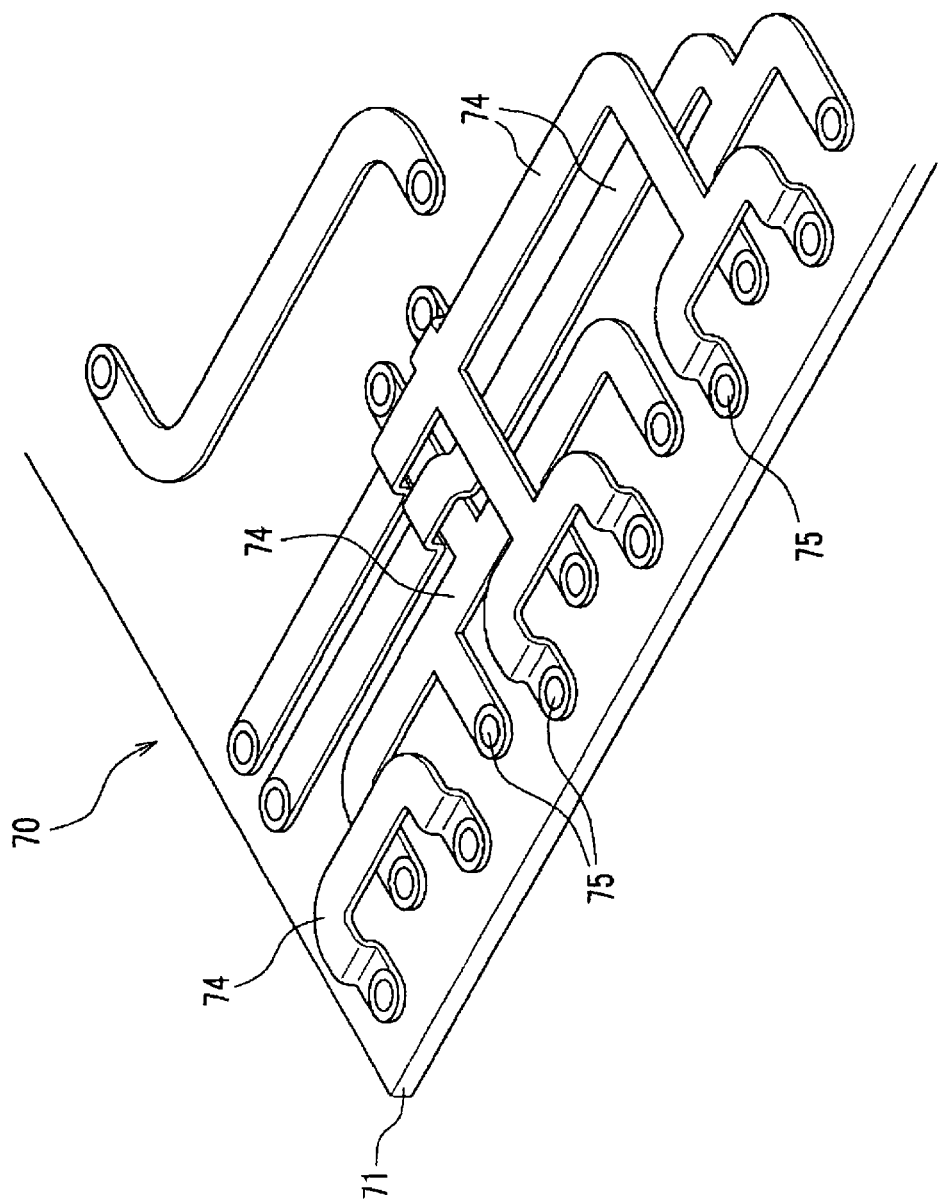
FIG. 10 is a perspective view schematically showing the large current circuit board of FIG. 9.

In a configuration shown in FIG. 4A and FIG. 4B, a power supply is turned on, and electric currents flow through current paths Sa,Sb as indicated by arrows in FIG. 4B. When a voltage of, for example, 600V is applied, electric currents of 200 A to 300 A flow therethrough. In this case, as shown in FIG. 4B, when voltages having opposite polarities are applied to the conductive layers 12a,12b, which are positioned above and below across the insulating layer 13b, electric currents in opposite directions flow therethrough. The opposite electric currents cancel respective magnetic fields generated by themselves. Next is described further the above phenomenon with reference to FIG. 4C. In the circuit board 1 according to the present invention as shown in FIG. 4C, as well as in the circuit boards in the aforementioned prior art with reference to FIG. 8 to FIG. 10, inductance components L1,L2 are present between the electronic components Db, and a positive power supply and a negative power supply, respectively. A combined inductance L of the entire circuit board 1 is represented as $L=(L1+L2\pm2M)$. Herein, M is a mutual inductance. However, in the circuit board 1 according to the present invention, the conductive layers 12a,12b are provided close to each other, and directions of the current paths Sa,Sb are opposite to each other. As a result, the magnetic fields generated by electric currents flowing through the conductive layers 12a,12b are cancelled, thus reducing a combined inductance (a surge reduction) to a substantially negligible extent.

As described above, the circuit board 1 according to the present invention ensures electrical connections not only at the interfaces 19a but also at the electrical interfaces 19b between the conductive terminal 15A and the conductive Layers 12a,12b and between the conductive terminal 15B and the conductive layers 12a,12b. A large electrical contact area therebetween in the present invention prevents a possible trouble caused by a flow of a large electric current owing to a local heat generation or the like. Thus the circuit board 1 is suitable for flowing a large electric current therethrough. Further, the present invention uses the counterbored holes and the conductive connecting material 19. This eliminates a need for an enlargement of a size of the circuit board 1 or processing of a number of through holes, which is otherwise required to flow a large electric current. Moreover, the present invention can be realized with a relatively simple process and configuration. The present invention also achieves an inductance reduction by providing the conductive layers 12a,12b close to each other in the multilayer board 11. It is to be noted that the electrical contact area at the interfaces 19a or the electrical interfaces 19b may be determined according to a size of the circuit board 1, a magnitude of an electric current to flow therethrough, or the like.

Second Embodiment

Next is described a second embodiment with reference to FIG. 5A to FIG. 5D. FIG. 5A to FIG. 5D are sequential cross sectional views showing a first step to a fifth step as key steps in the method of manufacturing a circuit board. A configuration of the second embodiment is the same as that of the first embodiment shown in FIG. 1, except that the number of layers stacked in the circuit board is different, and that a pair of counterbored holes are formed on both an upper surface and a lower surface of the circuit board. Descriptions of a configuration and a process which have been already mentioned in the first embodiment will be omitted herefrom.

<General Configuration of Circuit Board>

Figure 5A:
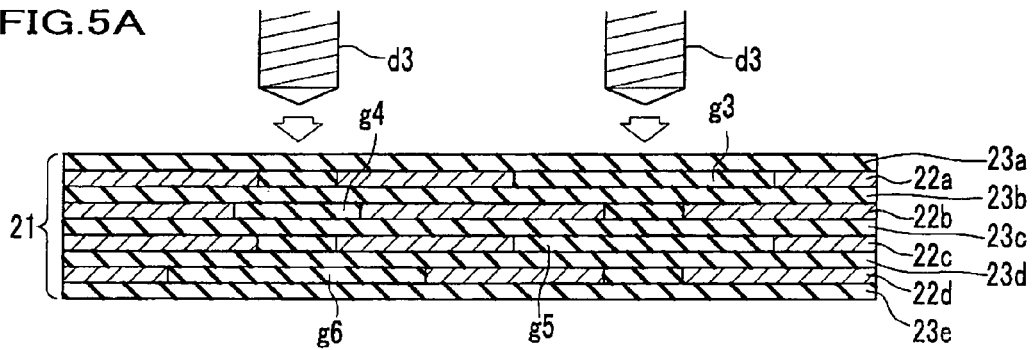
FIG. 5A to FIG. 5D are sequential cross sectional views each showing a key step in the method of manufacturing a circuit board according to a second embodiment.
Figure 5B:
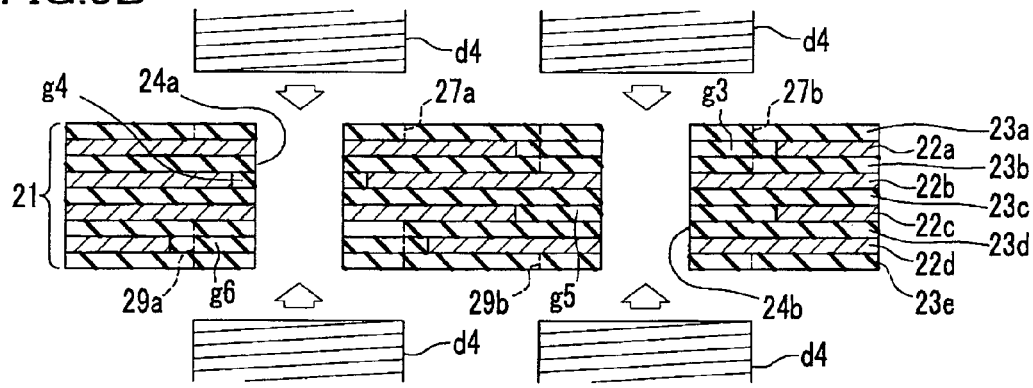
Figure 5C:
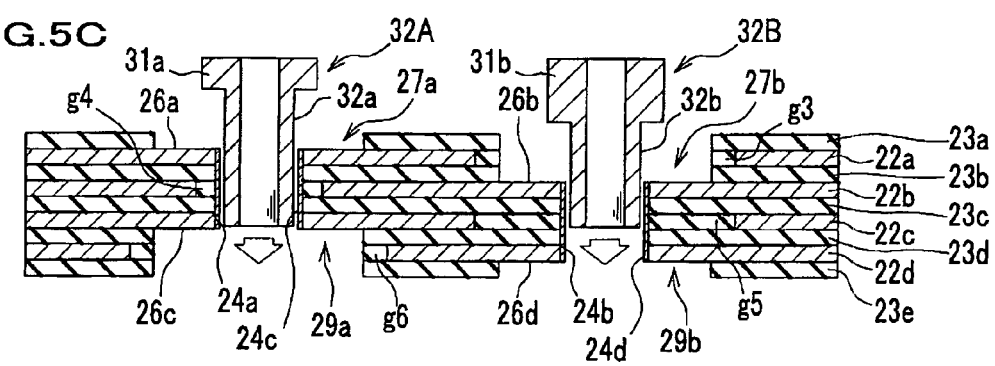
Figure 5D:
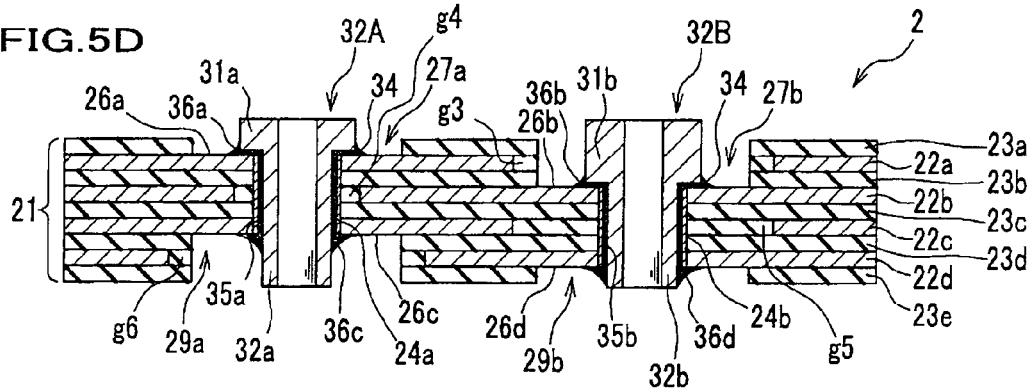

As shown in FIG. 5C and FIG. 5D, a circuit board 2 according to the second embodiment includes: a multilayer board 21, through hole pins 24c,24d, and conductive terminals 32A,32B, latter two of which are placed in the multilayer board 21.

The multilayer board 21 is configured such that insulating layers 23a,23b,23c,23d,23e and conductive layers 22a,22b, 22c,22d are alternately stacked.

The multilayer board 21 has cylindrical through holes 24a, 24b, which penetrate the multilayer board 21 at predetermined positions thereof; first counterbored holes 27a,27b, formed to reach from the insulating layer 23a to top surfaces of the conductive layers 22c,22d, respectively; and second counterbored holes 29a,29b formed to reach from the insulating layer 23e to lower surfaces of the conductive layers 22c,22d, respectively.

The multilayer board 21 has an insulating part g4 for ensuring insulation between a conductive terminal 32A and the conductive layer 22b; an insulating part g6 between the conductive terminal 32A and the conductive layer 22d; and an insulating part g3 between a conductive terminal 32B and the conductive layer 22a; and an insulating part g5 between the conductive terminal 32B and the conductive layer 22c.

<Electrical Connection between Second Counterbored Hole and Conductive Terminal>

As shown in FIG. 5D, body parts 32a,32b of the conductive terminals 32A,32B partly protrude from lower ends of the through holes 24a,24b, respectively, when the conductive terminals 32A,32B are set in the through holes 24a,24b via the through hole pins 24c,24d, respectively. This makes an electrical contact area between the conductive terminals 32A, 32B and partial lower surfaces 26c,26d larger, because the conductive terminals 32A,32B contact the partial lower surfaces 26c,26d, respectively, via conductive connecting material 34 applied to respective protruding portions of the body parts 32a,32b.

In other words, the conductive terminals 32A,32B have large electrical contact areas between flange parts 31a,31b thereof and partial upper surfaces 26a,26b, and between the protruding portions of the body parts 32a,32b and the partial lower surfaces 26c,26d, respectively. Thus the circuit board 2 is suitable for flowing a large electric current therethrough.

Lower ends of the conductive terminals 32A,32B protrude from a lower surface of the insulating layer 23e. Further, gaps are created on respective inner circumferences of the second counterbored holes 29a,29b. Thus, the electronic components Db (see FIG. 4) can be easily connected to the conductive terminals 32A,32B. Herein, the lower ends of the conductive terminals 32A,32B may be flush with or lower than the lower surface of the insulating layer 23e, according to a size of each of the electronic component Db, a height limit in a space where the circuit board 2 is used, or the like.

<Steps of Method of Manufacturing Circuit Board>

Next are described steps of a method of manufacturing the circuit board 2. Description of the steps which have already mentioned in the first embodiment shown in FIG. 2 will be simplified herein.

First, the multilayer board 21 is manufactured. Next, as a first step of the method, the through holes 24a,24b (see FIG. 5B) are created as shown in FIG. 5A. The through holes 24a,24b are formed by penetrating the multilayer board 21 in a thickness direction thereof with numerically-controlled small-diametered drills d3,d3.

As shown in FIG. 5B, a second step is a step of forming the first counterbored holes 27a,27b and the second counterbored holes 29a,29b in the multilayer board 21. In forming the first counterbored holes 27a,27b, numerically-controlled large-diametered drills d4,d4 are used to drill holes, such that the holes reach a partial upper surface 26a of the conductive layer 22a and a partial upper surface 26b of the conductive layer 22b, and are concentric with the through holes 24a,24b, respectively. In forming the counterbored holes 29a,29b, the numerically-controlled large-diametered drills d4,d4 are also used to drill holes, such that the holes reach the partial lower surface 26c of the conductive layer 22c and the partial lower surface 29d of the conductive layer 22d, and are concentric with the through holes 24a,24b, respectively. The drills d4,d4 used herein each has a flat tip thereof.

As shown in FIG. 5C, a third step is a step of fitting the conductive terminals 32A,32B into the multilayer board 21. Prior to the third step, however, an insertion step is herein performed, in which the through hole pins 24c,24d are inserted into the through holes 24a,24b, respectively. The through hole pins 24c,24d are provided to facilitate and ensure insertion of the conductive terminals 32A,32B, respectively. However, the through hole pins 24c,24d are not indispensably required and may be omitted. Namely, the conductive terminals 32A,32B may be inserted directly into the through holes 24a,24b, respectively. Instead of using the through hole pins 24c,24d, inner surfaces of the through holes 24a,24b may be metal plated.

The conductive terminals 32A,32B have flange parts 31a, 31b, and the body parts 32a,32b have lengths corresponding to depths of the second counterbored holes 29a,29b, respectively. Therefore, alignment of the conductive terminals 32A, 32B can be easily performed just by inserting the conductive terminals 32A,32B all the way into the through holes 24a,24b (in accordance with the through hole pins 24c,24d) so that lower ends of the flange parts 31a,31b come in contact with the partial upper surfaces 26a,26b, respectively.

As shown in FIG. 5D, a fourth step is a step of applying the conductive connecting material 34 around the flange parts 31a,31b of the conductive terminals 32A,32B and the body parts 32a,32b protruding from the through holes 24a,24b, respectively. A fifth step is a step of heating the circuit board 2 to a predetermined temperature in a reflow furnace or the like not shown. The conductive connecting material 34 melted by heating the circuit board 2 is flown into gaps between the conductive terminal 32A, the through hole pin 24C, and the through hole 24a, and between the conductive terminal 32B, the through hole pin 24d, and the through hole 24b. After the conductive connecting material 34 is sufficiently spread into the gaps, the conductive terminals 32A, 32B are set into the through holes 24a,24b, respectively, with large electrical contact areas obtained therebetween.

In this step, the conductive connecting material 34 forms conically-shaped electrical interfaces 36a to 36d between the partial upper surfaces 26a,26b of the conductive layers 22a, 22b and the flange parts 31a,31b, and between the body parts 21a,32b protruding from the through holes 24a,24b and the partial lower surfaces 26c,26d of the conductive layers 22c, 22d, respectively. The electrical interfaces 36a to 36d, and the interfaces 35a,35b between the conductive terminals 32A, 32B and the through holes 24a,24b provide a current path having a large electrical contact area, thus allowing a large electric current to flow through the circuit board 2.

In the second step, the first counterbored holes 27a,27b may be formed first, and then, the second counterbored holes 29a,29b may be formed, or vice versa. Or, the first counterbored holes 27a,27b and the second counterbored holes 29a, 29b may be formed simultaneously.

The circuit board 2 manufactured as described above can flow a large electric current therethrough with a relatively simple configuration thereof and without increasing a size thereof.

Further, in this embodiment as shown in FIG. 5A to FIG. 5D, voltages having opposite polarities are applied to the conductive layers 22a,22b (namely, directions of electric currents flowing therethrough are opposite to each other). Voltages having opposite polarities are also applied to the conductive layers 22c,22d. This results in reduction of a combined inductance (a surge) in the circuit board 2, as in the first embodiment.

Third Embodiment

Figure 6A:
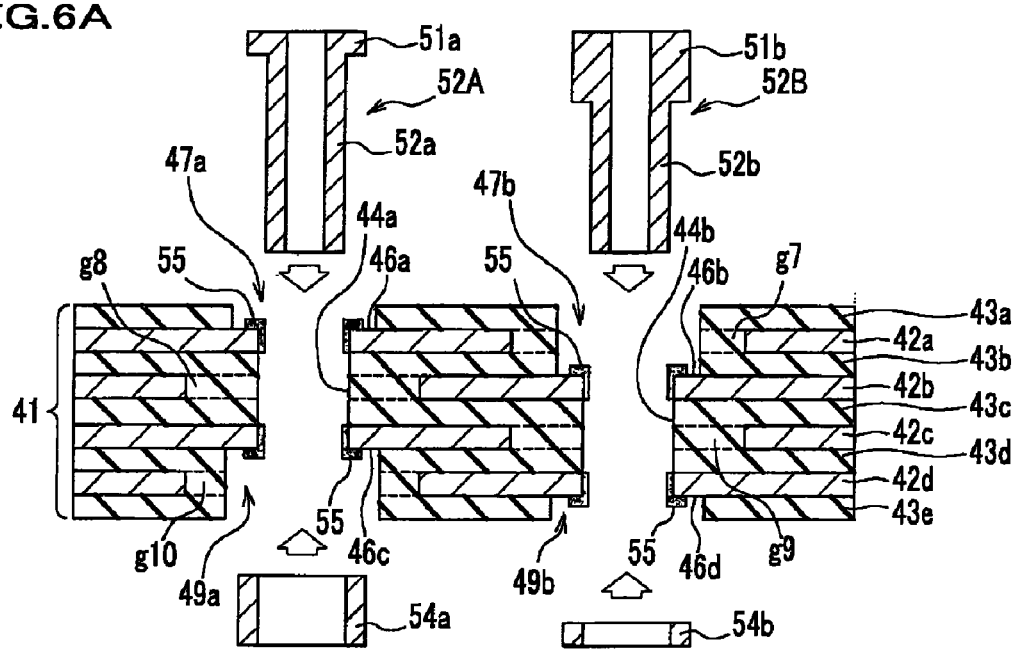
FIG. 6A to FIG. 6C are sequential cross sectional views each showing a key step of the method of manufacturing a circuit board according to a third embodiment.
Figure 6B:
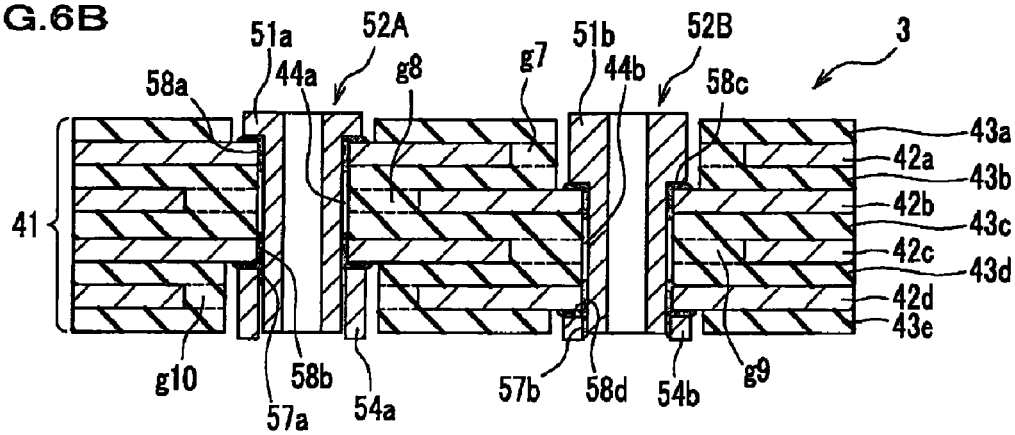
Figure 6C:
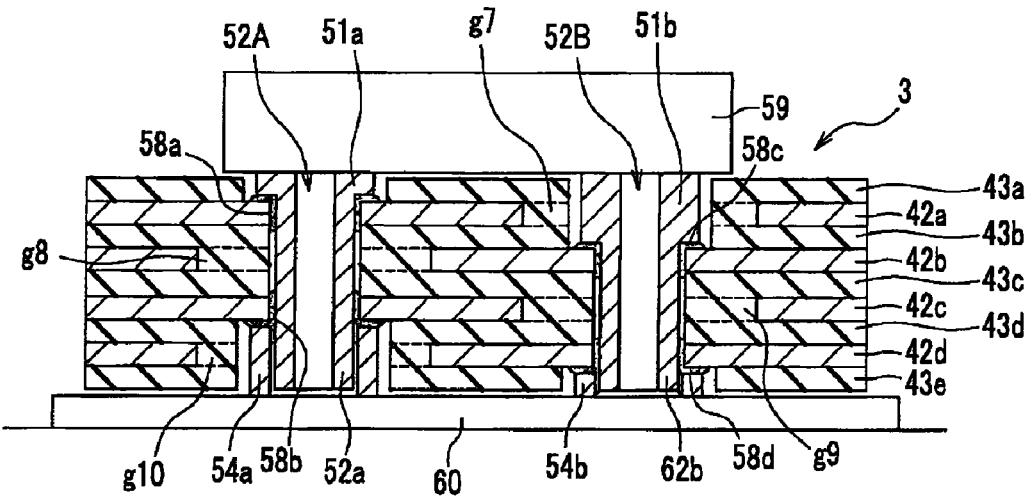

Next are described a circuit board and key steps of a method of manufacturing the circuit board according to a third embodiment with reference to FIG. 6A, FIG. 6B and FIG. 6C. FIG. 6A, FIG. 6B and FIG. 6C are sequential cross sectional views each showing a key step of the method of manufacturing the circuit board according to the third embodiment.

A configuration of the third embodiment is the same as that of the embodiments described above, except that no through hole pin is used, and that second flange parts are provided in the third embodiment. Difference between the third and the other embodiments is mainly described herein, and description of same configurations is omitted herefrom.

<General Configuration of Circuit Board>

As shown in FIG. 6A, FIG. 6B and FIG. 6C, a circuit board 3 includes a multilayer board 41; first counterbored holes 47a,47b and second counterbored holes 49a,49b each formed concentric with through holes 44a,44b, respectively, the through holes 44a,44b penetrating the multilayer board 41 at predetermined positions thereof; and conductive terminals 52A,52B set into the through holes 44a,44b via the first counterbored holes 47a,47b and the second counterbored holes 49a,49b, respectively. Conductive layers 42a,42b,42c, 42d have insulating parts g7,g8,g9,g10 around the first counterbored holes 47b, the through holes 44a,44b, and the second counterbored hole 49a, respectively.

The conductive terminals 52A,52B include first flange parts 51a,51b thereof integrally formed on one ends of body parts 52a,52b thereof, respectively. The conductive terminals 52A,52B also include second flange parts 54a,54b, which can be freely attached to and removed from the other ends of the body parts 52a,52b, respectively.

The second flange parts 54a,54b are formed in ring shapes having larger diameters than those of the body parts 52a,52b, respectively. The second flange parts 54a,54b and the body parts 52a,52b are made of the same material (copper, for example). The second flange parts 54a,54b are formed to have depths corresponding to the second counterbored holes 49a, 49b, respectively. The second flange parts 54a,54b are also formed to have lengths enough to come in contact with the conductive layers 42c,42d exposed by the second counterbored holes 49a,49b, respectively, and enough to slightly protrude from an undermost surface of the multilayer board 41, when the second flange parts 54a,54b are set from the other ends of the body parts 52a,52b, respectively.

In the configuration described above, an electrical contact area in the circuit board 3 can be made large, because the first flange parts 51a,51b come in contact with the partial upper surfaces 46a,46b of the conductive layers 42a,42b exposed by the first counterbored holes 47a,47b, and the second flange parts 54a,54b come in contact with the partial lower surfaces 46c,46d of the conductive layers 42c,42d exposed by the second counterbored holes 49a,49b, respectively.

<Steps of Method of Manufacturing Circuit Board>

Next is described the method of manufacturing the circuit board 3.

The same steps as those described above in FIG. 5 are used in the third embodiment for forming the multilayer board 41, through holes 44a,44b, first counterbored holes 47a,47b, and second counterbored holes 49a,49b.

As shown in FIG. 6A, after the first counterbored holes 47a,47b and second counterbored holes 49a,49b are created, conductive connecting material 55 such as cream molder is applied to portions of the conductive layers 42a to 42d, which are exposed by the through holes 44a,44b, the first counterbored holes 47a,47b, and the second counterbored holes 49a, 49b, respectively (a third step).

Then the conductive terminals 52A,52B are placed into the through holes 44a,44b (a fourth step and a fifth step). The conductive terminals 52A,52B are fitted thereinto in a state where the second flange parts 54a,54b are removed. Then, as shown in FIG. 6B, the second flange parts 54a,54b are fitted into the body parts 52a,52b protruding from the first counterbored holes 47a,47b of the fitted conductive terminals 52A, 52B, respectively.

As shown in FIG. 6C, after the conductive terminals 52A, 52B are set in the multilayer board 41, the conductive terminals 52A,52B are soldered thereto, by heating the circuit board 3 to a predetermined temperature in a reflow furnace or the like (not shown) (a sixth step). If the circuit board 3 is heated with a weight 59 put thereon, the second flange parts 54a,54b hardly move, and are soldered at appropriate positions. It would be preferable to select a material of the weight 59 such that the material ensures contact between the body parts 52a,52b and the second flange parts 54a,54b, does not undergo a chemical change or a deformation even at a high temperature during reflow treatment, and does not damage the multilayer board 41.

In the circuit board 3 manufactured through the steps described above, the conductive connecting material 55 forms electrical interfaces 58a to 58d between the first flange parts 51a,51b and the conductive terminals 52A,52B, and between the second flange parts 54a,54b, and the conductive terminals 52A,52B on upper or lower surfaces of the conductive layers 42a to 42d. As a result, in the circuit board 3, the electrical interfaces 58a to 58d can provide an electric current path having a large electrical contact area, in which a large electric current can flow through the conductive layers 42a to 42d. In the third embodiment shown in FIG. 6, voltages having opposite polarities are applied to the conductive layers 42a,42b (namely, directions of electric currents flowing therethrough are opposite to each other). Voltages having opposite polarities are also applied to the conductive layers 42c,42d. This results in reduction of a combined inductance (a surge) in the circuit board 3, as in the first embodiment.

The other ends of the body parts 52a,52b of the conductive terminals 52A,52B may be formed into external screws (not shown), and the second flange parts 54a,54b may be formed into internal screws. In this case, the second flange parts 54a,54b may be screwed into the conductive terminals 52A, 52B fitted into the through holes 44a,44b, respectively. This ensures connection between the body parts 52a,52b and the second flange parts 54a,54b, respectively. Further, the second flange parts 54a,54b may be just screwed into the body parts 52a,52b without using the weight 59.

In the second and third embodiments described with reference to FIG. 5, FIG. 6, respectively, the multilayer boards 21,41 with the first counterbored holes created therein may be turned upside down, and may be subjected to processing of forming a lower-positioned second counterbored hole or a lower-positioned conductive interface from above.

In FIG. 6, the through hole pins or metal plating in the through holes are not provided. However, if metal plating is provided in the through holes 44a,44b, an increase of an area jointed by the metal plating enhances joint strength of the circuit board 3. Further, metal plating realizes a more reliable and solderable soldering, when a subsequent solder joint is performed through reflow treatment or the like, because solder can easily spread into minute gaps between the conductive terminals 52A,52B and the through holes 44a,44b.

The above embodiments have configurations in which the counterbored holes (first and second counterbored holes) 17a (17b . . . ) are formed as cylindrical recesses (first and second cylindrical recesses); and an electrical contact area is made larger by electrically connecting the flange part 18a (18b . . . ) of the conductive terminal 15A (15B . . . ) to the partial upper surface 16a (16b . . . ) or the partial lower surface 26c (26d . . . ) of the conductive layer 12a (17b . . . ) exposed by the counterbored hole 17a (17b . . . ), via the conductive connecting material 19. However, as shown in FIG. 7, the electrical contact area may be made larger without using the flange part 18a (18b . . . ).

Fourth Embodiment

Figure 7A:
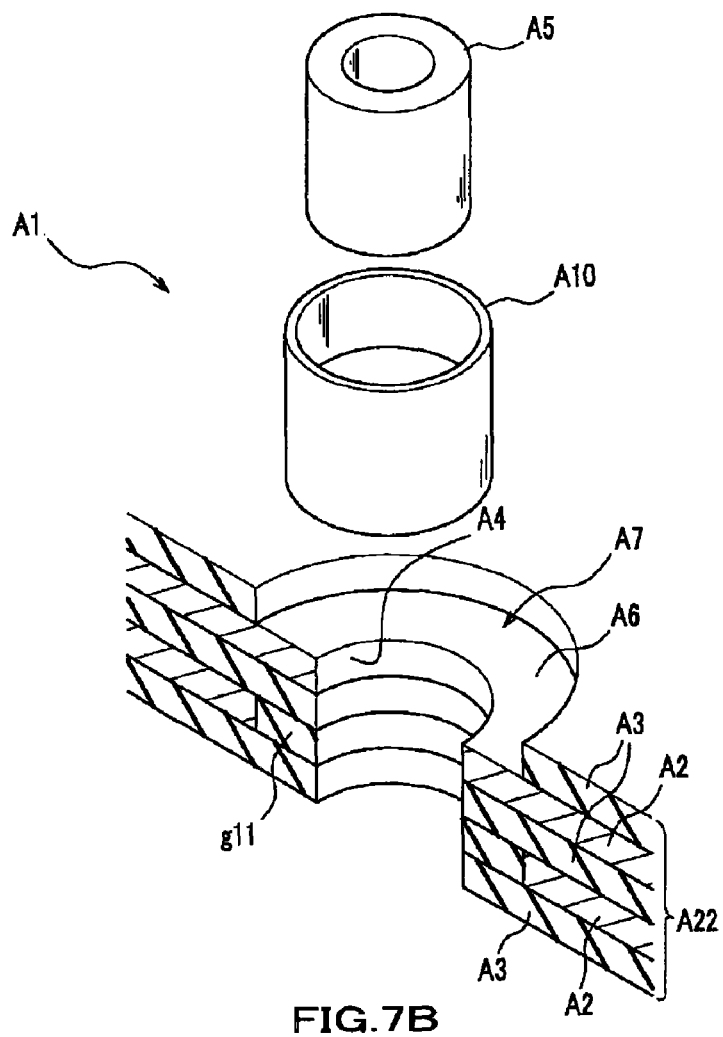
FIG. 7A is an exploded perspective view schematically showing a partially broken circuit board according to a fourth embodiment.
Figure 7B:
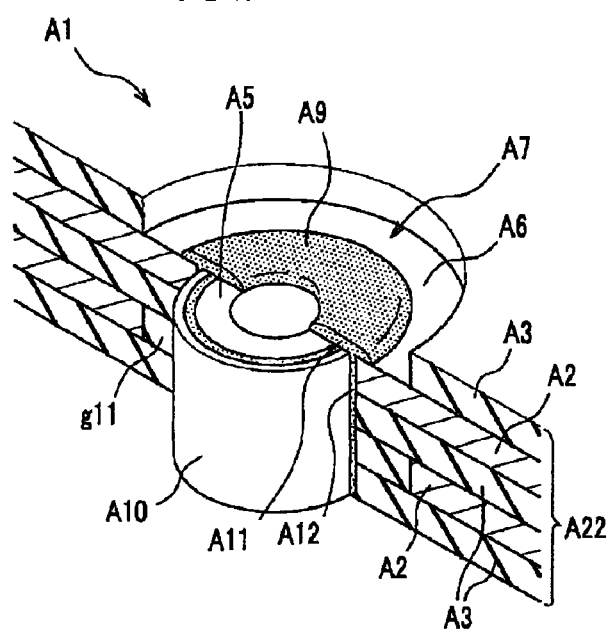
FIG. 7B is a perspective view schematically showing the partially broken circuit board according to the fourth embodiment.

FIG. 7A is an exploded perspective view schematically showing a partially broken circuit board according to a fourth embodiment. FIG. 7B is a view schematically showing the partially broken circuit board according to the fourth embodiment. A configuration of the fourth embodiment shown in FIG. 7A and FIG. 7B is the same as those of the above embodiments, except that the conductive terminals used in the fourth embodiment do not have any flange parts. Same configurations which have already been described in the above embodiments are omitted herefrom.

<Configuration of Circuit Board>

As shown in FIG. 7A and FIG. 7B, a circuit board A1 includes a multilayer board A22; a first counterbored hole (cylindrical recess) A7 formed concentric with a through hole A4, the through hole A4 being provided at a predetermined position of the multilayer board A22; a through hole pin A10 fitted into the through hole A4; and a conductive terminal A5 electrically connected to the through hole pin A10 via conductive connecting material A9. The conductive terminal A5 used herein is cylindrical-shaped, thicker than the through hole pin A10, and made of a conductive material such as copper. An insulating part g11 is provided around a portion of the through hole A4, which is positioned adjacent to one of conductive layers A2, so as to ensure insulation between the conductive layer A2 and the conductive terminal A5.

The multilayer board A22 is configured such that insulating layers A3,A3,A3 and conductive layers A2,A2 are alternately stacked. The through hole A4 is formed at a predetermined position in the multilayer board A22. A counterbored hole A7 is also formed concentric with the through hole A4 in the multilayer board A22, such that a partial upper surface A6 of the conductive layer A2 exposes from the insulating layer A3. The circuit board A1 has a through hole pin A10 in the through hole A4. In the through hole pin A10, a conductive terminal A5 is placed. The circuit board A1 also has conductive connecting material A9 such as solder or cream solder, such that an electrical contact area is made large between the partial upper surface A6 of the conductive layer A2 exposed by the counterbored hole A7, and an end of the conductive terminal A5.

The circuit board A1 is configured to have an interface A11 and an electrical interface A12, which are electrically connected to the partial upper surface A6 of the conductive layer A2 via the conductive connecting material A9 thanks to a formation of the counterbored hole A7. Thus the circuit board A1 has a large electrical contact area, and can flow a large electric current therethrough with a simple configuration thereof.

<Method of Manufacturing Circuit Board>

In a method of manufacturing the circuit board A1, a step of forming the multilayer board A22, a step of forming the through hole A4, a step of drilling the counterbored hole A7, and a step of setting the through hole pin A10 are performed as aforementioned. In a step of fitting the conductive terminal A5 into the through hole pin A10, the multilayer board A22 is placed on a flat surface, or the conductive connecting material A9 such as cream solder or the like is applied to an inner surface of the through hole pin A10 as a temporary joint, so as to prevent the conductive terminal A5 from falling off from the through hole pin A10.

Alignment of the conductive terminals A5 is easily performed just by inserting the conductive terminal A5 all the way into the through hole pin A10, because the conductive terminal A5 has a length corresponding to a depth of the through hole pin A10.

After the conductive terminal A5 is fitted into the through hole pin A10, the conductive connecting material A9 is applied such that the electrical interface A12 is formed for electrically connecting the conductive terminal A5 and the partial upper surface A6 exposed by the counterbored hole A7, and that an interface A11 is also formed in the through hole A4. Then the circuit board A1 is heated to a predetermined temperature, to thereby fit the conductive terminal A5 into the circuit board A1.

<Variations of Configuration>

In FIG. 7, the conductive terminal A5 is fitted into the through hole A4 via the conductive through hole pin A10, which is in contact with an inner surface of the through hole A4 as well as an outer surface of the conductive terminal A5. However, the conductive terminal A5 may be directly fitted into the through hole A4 without the through hole pin A10. Further, metal plating may be provided in an inner surface of the through hole A4, instead of providing the through hole pin A10.

In the present invention, the numbers of the through holes, conductive layers, and insulating layers are not limited to those described in the above embodiments. Further, in the present invention, a circuit board through which an electric current of a desired magnitude flows can be configured by selecting a thickness and the number of the conductive layers accordingly.

In the above embodiments, a counterbored hole is formed concentric with a through hole corresponding thereto. However, the counterbored hole or a cylindrical recess may have a center thereof offset from that of the through hole. Further, if the cylindrical recess has the center offset from that of the through hole, a flange part thereof may be formed accordingly.

The drills d1 to d4 may not have same diameters as those of holes to be drilled therewith. For example, the small-diametered drills d1,d3 may be used more than once to drill the large-diametered counterbored holes 17a,17b.

The embodiments according to the present invention have been explained as aforementioned. However, the embodiments of the present invention are not limited to those explanations, and those skilled in the art ascertain the essential characteristics of the present invention and can make the various modifications and variations to the present invention to adapt it to various usages and conditions without departing from the spirit and scope of the claims.

The invention claimed is:

1. A circuit board comprising:
    a multilayer board, in which a plurality of insulating layers and a plurality of conductive layers are alternately stacked; and
    a plurality of conductive terminals, which are fitted into a plurality of through holes extending in a thickness direction of the multilayer board at predetermined positions thereof,
    the multilayer board having cylindrical recesses each of which is formed around a through hole corresponding thereto, has a diameter larger than that of the through hole, has a depth starting from an outermost insulating layer in the multilayer board to a surface of a predetermined conductive layer in the multilayer board, such that the multilayer board has the predetermined conductive layer of which the surface is partially exposed via the recess, and
    the predetermined conductive layer and the conductive terminal being electrically connected at an interface between the predetermined conductive layer and the conductive terminal in the through hole, and at an electrical interface between the conductive terminal and the surface, which is partially exposed via the recess, of the predetermined conductive layer at the conductive terminal.

2. The circuit board according to claim 1, wherein the conductive terminal includes a body part and a flange part.

3. The circuit board according to claim 1, wherein at least either a through hole pin or a metal plated part is provided in the through hole, and the conductive terminal is fitted into an inner surface of the through hole pin or the metal plated part.

4. The circuit board according to claim 1, wherein at least either the interface or the electrical interface connects the conductive layer and the conductive terminal via conductive connecting material.

5. The circuit board according to claim 4, wherein the conductive connecting material is solder.

6. The circuit board according to claim 1, wherein a total number of the conductive layers in the multilayer board is 2n (n is a natural number), and voltages having opposite polarities are applied to a pair of the conductive layers positioned above and below across the insulating layer.

7. The circuit board according to claim 1, wherein the cylindrical recesses are formed on both an upper surface and a lower surface of the circuit board.

8. The circuit board according to claim 2, wherein grooves for stopping a screw is provided on an inner surface of at least either the conductive terminal or a through hole pin provided in the through hole.

* * * * *